(12) United States Patent
Yoon et al.

(10) Patent No.: US 10,068,635 B2
(45) Date of Patent: *Sep. 4, 2018

(54) MEMORY DEVICE INCLUDING DELAY CIRCUIT HAVING GATE INSULATION FILMS WITH THICKNESSES DIFFERENT FROM EACH OTHER

(71) Applicant: Samsung Electronics Co., Ltd., Suwon-si (KR)

(72) Inventors: Ho-sung Yoon, Seoul (KR); Doo-young Kim, Seongnam-si (KR)

(73) Assignee: SAMSUNG ELECTRONICS CO., LTD., Samsung-ro, Yeongtong-gu, Suwon-si, Gyeonggi-do (KR)

(*) Notice: Subject to any disclaimer, the term of this patent is extended or adjusted under 35 U.S.C. 154(b) by 0 days.

This patent is subject to a terminal disclaimer.

(21) Appl. No.: 15/701,636

(22) Filed: Sep. 12, 2017

(65) Prior Publication Data
US 2018/0005688 A1    Jan. 4, 2018

Related U.S. Application Data

(62) Division of application No. 15/206,354, filed on Jul. 11, 2016, now Pat. No. 9,792,976.

(30) Foreign Application Priority Data

Oct. 29, 2015    (KR) .................... 10-2015-0151098

(51) Int. Cl.
*G11C 7/00*        (2006.01)
*G11C 11/4076*    (2006.01)
(Continued)

(52) U.S. Cl.
CPC ...... *G11C 11/4076* (2013.01); *G11C 11/4096* (2013.01); *H01L 27/108* (2013.01); *H01L 29/42364* (2013.01); *H03K 5/15066* (2013.01)

(58) Field of Classification Search
CPC ............. G11C 11/4076; G11C 11/4096; H01L 27/108; H01L 29/42364; H03K 5/15066
(Continued)

(56) References Cited

U.S. PATENT DOCUMENTS 6,424,206 B2    7/2002    Takahashi et al.
6,584,031 B2    6/2003    Fujisawa et al.
(Continued)

FOREIGN PATENT DOCUMENTS

JP            4389300        10/2009
KR    10-2002-0001549        1/2002
(Continued)

*Primary Examiner* — Fernando Hidalgo
(74) *Attorney, Agent, or Firm* — Muir Patent Law, PLLC

(57) ABSTRACT

Provided is a memory device including a delay circuit having gate insulation films with thicknesses different from each other. The memory device includes a delay circuit configured to input an input signal and output an output signal, and circuit blocks configured to control an operation of reading or writing memory cell data in response to the input signal or the output signal. One of transistors constituting a circuit block has a gate insulation film having such a thickness that an effect of negative biased temperature instability (NBTI) or positive biased temperature instability (PBTI) on the transistors is minimized. The delay circuit may be affected little by a shift in a threshold voltage that may be caused by NTBI or PBTI, and thus, achieve target delay time.

19 Claims, 15 Drawing Sheets

(51) Int. Cl.
*H03K 5/15* (2006.01)
*H01L 29/423* (2006.01)
*G11C 11/4096* (2006.01)
*H01L 27/108* (2006.01)

(58) Field of Classification Search
USPC ......... 365/194, 45, 46, 51, 52, 63, 129, 148,
365/149, 174, 175, 189.011, 189.14,
365/189.15, 189.16, 189.05
See application file for complete search history.

(56) References Cited

U.S. PATENT DOCUMENTS

| | | | |
|---|---|---|---|
| 6,914,285 B2 | 7/2005 | Kim et al. | |
| 7,282,377 B2 | 10/2007 | Muranaka | |
| 7,427,791 B2 | 9/2008 | Matsuzaki et al. | |
| 7,472,038 B2 | 12/2008 | Bose et al. | |
| 9,281,048 B2 | 3/2016 | Kim et al. | |
| 2004/0061158 A1* | 4/2004 | Kim | H01L 21/823462 257/296 |
| 2006/0232316 A1 | 10/2006 | Nomura | |
| 2008/0106954 A1* | 5/2008 | Sinha | G11C 7/04 365/194 |
| 2014/0312961 A1 | 10/2014 | Seo | |
| 2015/0155029 A1* | 6/2015 | Kim | G11C 11/40615 365/222 |
| 2015/0363021 A1* | 12/2015 | Nakaue | G06F 3/044 345/174 |
| 2016/0105163 A1* | 4/2016 | Chen | H03K 3/356165 327/333 |

FOREIGN PATENT DOCUMENTS

| | | |
|---|---|---|
| KR | 10-0482370 | 4/2005 |
| KR | 10-2014-0126146 | 10/2014 |
| KR | 10-2015-0062766 | 6/2015 |

* cited by examiner

THICK GOX TR

MEMORY DEVICE INCLUDING DELAY CIRCUIT HAVING GATE INSULATION FILMS WITH THICKNESSES DIFFERENT FROM EACH OTHER

CROSS-REFERENCE TO RELATED APPLICATION

This application is a divisional of U.S. patent application Ser. No. 15/206,354, filed Jul. 11, 2016, in the U.S. Patent and Trademark Office, which claims the benefit of priority under 35 U.S.C. § 119 to Korean Patent Application No. 10-2015-0151098, filed on Oct. 29, 2015, in the Korean Intellectual Property Office, the disclosures of both of which are incorporated herein in their entireties by reference.

BACKGROUND

The disclosed embodiments relate to a semiconductor device, and more particularly, to a memory device including a delay circuit having gate insulation films with thicknesses different from each other so as to prevent deterioration of characteristics of the delay circuit.

According to advances in semiconductor manufacture technology, various circuits (e.g., metal-oxide semiconductor (MOS) transistors) are formed on an integrated circuit (IC). The IC is used in customer electronics, and helps to ensure optimum operation performance in various application uses. The IC should satisfy reliability requirements for ensuring operation performance for a certain period of time. Phenomena such as negative biased temperature instability (NBTI) or positive biased temperature instability (PBTI) may cause deterioration of the reliability of transistors. Such phenomena may cause a shift in a threshold voltage (Vth) of transistors, and a shift in the threshold voltage (Vth) of transistors may cause deterioration of performance of ICs or a problem in voltage sensitivity.

SUMMARY

The disclosed embodiments provide a delay circuit including transistors having gate insulation films with thicknesses different from each other, so as to reduce an effect of negative biased temperature instability (NBTI) or positive biased temperature instability (PBTI).

The disclosed embodiments provide a memory device including the delay circuit.

According to certain aspects, the disclosure is directed to a delay circuit comprising: a first resistor comprising a first set of one or more transistors connected between a source of a power voltage and a first node; a second resistor comprising a second set of one or more transistors connected between the second node and a ground voltage, an inverter comprising a third set of one or more transistors connected between the first node and the second node, the inverter configured to receive an input signal, invert the input signal, and output the inverted input signal as an output signal; and wherein two or more of the transistors from among the first set, the second set, and the third set have gate insulation films having thicknesses different from each other.

In some aspects, the disclosure further includes wherein the inverter comprises: a first transistor having a source connected to the first node, a drain connected to the output signal, and a gate connected to the input signal; and a second transistor having a source connected to the second node, a drain connected to the output signal, and a gate connected to the input signal.

In some aspects, the disclosure further includes wherein the gate insulation film of the first transistor is thickest among the gate insulation films of the transistors included in the inverter, the first resistor, and the second resistor.

In some aspects, the disclosure further includes wherein the gate insulation film of the second transistor is thicker than the gate insulation films of the transistors included in the inverter, the first resistor, and the second resistor.

In some aspects, the disclosure further includes wherein the gate insulation film of at least one transistor of the first set of transistors is thickest among the gate insulation films of the transistors included in the inverter, the first resistor, and the second resistor.

In some aspects, the disclosure further includes wherein the gate insulation film of the at least one transistor of the second set of transistors is thickest among the gate insulation films of the transistors included in the inverter, the first resistor, and the second resistor.

In some aspects, the disclosure further includes wherein the delay circuit further comprises: a loader comprising at least two capacitors connected to the output signal.

In some aspects, the disclosure further includes wherein one of the at least two capacitors is implemented as a transistor having the thickest gate insulation film among the transistors included in the inverter, the first resistor, and the second resistor.

In certain aspects, the disclosure is direct to a memory device comprising: a delay circuit including a plurality of transistors and configured to receive an input signal, invert the input signal, and output the inverted input signal as an output signal; and circuit blocks configured to control an operation of reading or writing memory cell data in response to at least one of the input signal or the output signal, wherein at least two of the plurality of transistors include gate insulating films having different thicknesses, and wherein at least one of the plurality of transistors included in the delay circuit has a thickest gate insulation film among the transistors included in the delay circuit.

In some aspects, the disclosure further includes wherein a thickness of the thickest gate insulation film in the delay circuit is determined as having a value such that an effect of negative biased temperature instability (NBTI) or positive biased temperature instability (PBTI) on the transistors is minimized.

In some aspects, the disclosure further includes wherein the delay circuit comprises: a first resistor comprising a first set of one or more transistors connected between a source of a power voltage and a first node; a second resistor comprising a second set of one or more transistors connected between a second node and a ground voltage; and an inverter comprising a third set of one or more transistors connected between the first node and the second node, and configured to invert an input signal and output the inverted input signal as an output signal.

In some aspects, the disclosure further includes wherein the third set of one or more transistors of the inverter comprises: a first transistor having a source connected to the first node, a drain connected to the output signal, and a gate connected to the input signal; and a second transistor having a source connected to the second node, a drain connected to the output signal, and a gate connected to the input signal.

In some aspects, the disclosure further includes wherein the delay circuit further comprises: a loader comprising at least two capacitors connected to the output signal.

In some aspects, the disclosure further includes wherein one of the at least two capacitors is implemented as a transistor having the thickest gate insulation film among the transistors comprised in the delay circuit.

In some aspects, the disclosure further includes wherein each of the circuit blocks includes a plurality of circuit block transistors, and in each of the circuit blocks, at least one of plurality of circuit block transistors has a thicker insulation film among the transistors included in the circuit block.

In certain aspects, the disclosure is directed to a delay circuit comprising: a first resistor comprising a first set of one or more transistors connected between a source voltage and a first node; a second resistor comprising second set of one or more transistors connected between a second node and a ground voltage; an inverter comprising a third set of one or more transistors connected between the first node and the second node, the inverter configured to receive an input signal, invert the input signal, and output the inverted input signal as an output signal; and a loader comprising a plurality of capacitors connected to the output signal, wherein gates of the third set of one or more transistors are connected in parallel to the input signal and drains of the plurality of third transistors are connected in parallel to the output signal, wherein two or more of the transistors from among the first set, the second set, the third set, and the plurality of capacitors have gate insulation films having thicknesses different from each other.

In some aspects, the disclosure further includes wherein a gate insulation film of a first transistor of the third set is thicker than gate insulation films of a second transistor of the third set and the second set of transistors.

In some aspects, the disclosure further includes wherein a gate insulation film of a first transistor of the third set is thicker than gate insulation films of a second transistor of the third set and the first set of transistors.

In some aspects, the disclosure further includes wherein one of the at least two capacitors is implemented as a transistor having a gate insulation film thicker than gate insulation films of the first set, the second set, and the third set.

In some aspects, the disclosure further includes wherein the gate insulation films of either the first set or the second set is thickest among the gate insulation films of the at least one first transistor, the at least one second transistor, and the at least one third transistor.

BRIEF DESCRIPTION OF THE DRAWINGS

Exemplary embodiments will be more clearly understood from the following detailed description taken in conjunction with the accompanying drawings in which.

DETAILED DESCRIPTION OF THE EMBODIMENTS

Figure 1:
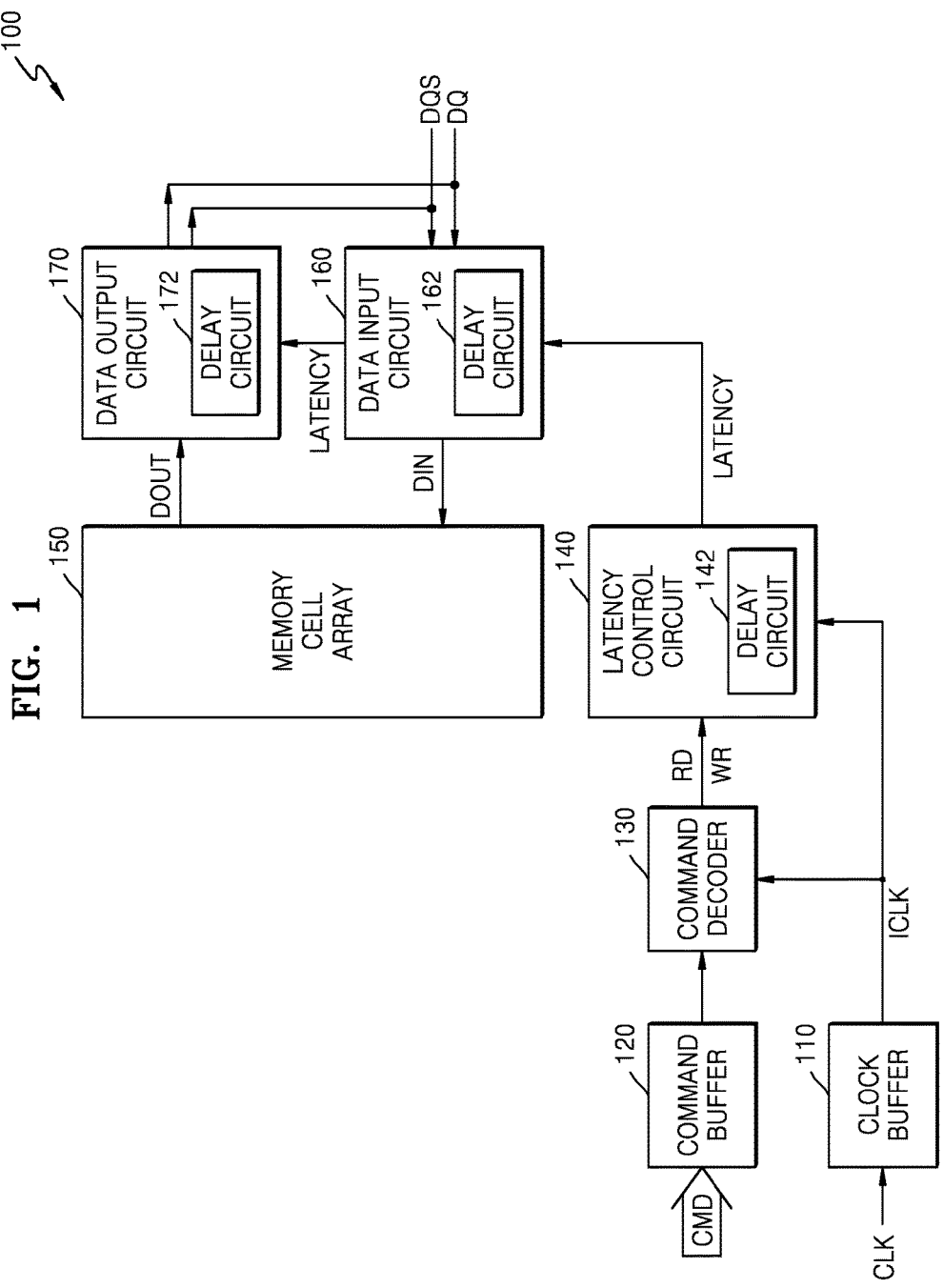
FIG. 1 is a block diagram showing a memory device that includes delay circuits, according to certain exemplary embodiments.

As used herein, the term "and/or" includes any and all combinations of one or more of the associated listed items. Expressions such as "at least one of," when preceding a list of elements, modify the entire list of elements and do not modify the individual elements of the list.

The attached drawings for illustrating embodiments are referred to in order to gain a sufficient understanding of embodiments, the merits thereof, and the objectives accomplished by the implementation of the embodiments.

Embodiments will now be described more fully with reference to the accompanying drawings. Embodiments may, however, be embodied in many different forms and should not be construed as being limited to the embodiments set forth herein. As embodiments allow for various changes and numerous forms, particular embodiments will be illustrated in the drawings and described in detail in the written description. However, this is not intended to be limiting, and it is to be appreciated that all changes, equivalents, and substitutes that do not depart from the spirit and technical scope of the embodiments are encompassed in the embodiments. These example embodiments are just that—examples—and many implementations and variations are possible that do not require the details provided herein. It should also be emphasized that the disclosure provides details of alternative examples, but such listing of alternatives is not exhaustive. Furthermore, any consistency of detail between various examples should not be interpreted as requiring such detail—it is impracticable to list every possible variation for every feature described herein. The language of the claims should be referenced in determining the requirements of the invention.

Like reference numerals in the drawings denote like elements, and thus their description will be omitted. In the drawings, the lengths and sizes of layers and regions are exaggerated for clarity. Though the different figures show variations of exemplary embodiments, these figures are not necessarily intended to be mutually exclusive from each other. Rather, as will be seen from the context of the detailed description below, certain features depicted and described in different figures can be combined with other features from other figures to result in various embodiments, when taking the figures and their description as a whole.

The terms used in the present specification are merely used to describe particular embodiments, and are not intended to limit the embodiments. An expression used in the singular encompasses the expression of the plural, unless it has a clearly different meaning in the context. In the present specification, it is to be understood that the terms such as "comprising," "including," "having," etc., are intended to indicate the existence of the features, numbers, steps, actions, elements, components, parts, or combinations thereof disclosed in the specification, and are not intended to preclude the possibility that one or more other features, numbers, steps, actions, elements, components, parts, or combinations thereof may exist or may be added.

The terminology used herein to describe embodiments is not intended to limit the scope of the disclosed concepts. The articles "a," "an," and "the" are singular in that they have a single referent; however, the use of the singular form in the present document should not preclude the presence of more than one referent. In other words, elements referred to in the singular form may number one or more, unless the context clearly indicates otherwise.

It will be understood that when an element or layer is referred to as being "on," "connected to," or "coupled to" another element or layer, it can be directly on, connected to, or coupled to the other element or layer or intervening elements or layers may be present. In contrast, when an element is referred to as being "directly on," "directly connected to," or "directly coupled to" another element or layer, or as "contacting" or "in contact with" another element or layer, there are no intervening elements or layers present. In the following explanation, the same reference numerals denote the same components throughout the specification.

It will be understood that, although the terms first, second, third etc. may be used herein to describe various elements, components, regions, layers and/or sections, these elements, components, regions, layers and/or sections should not be limited by these terms. Unless the context indicates otherwise, these terms are only used to distinguish one element, component, region, layer or section from another element, component, region, layer or section, for example as a naming convention. Thus, a first element, component, region, layer or section discussed below in one section of the specification could be termed a second element, component, region, layer or section in another section of the specification or in the claims without departing from the teachings of the present invention. In addition, in certain cases, even if a term is not described using "first," "second," etc., in the specification, it may still be referred to as "first" or "second" in a claim in order to distinguish different claimed elements from each other.

Spatially relative terms, such as "beneath," "below," "lower," "above," "upper," and the like may be used herein to describe the relationship of one element or feature to another, as illustrated in the drawings. It will be understood that such descriptions are intended to encompass different orientations in use or operation in addition to orientations depicted in the drawings. For example, if a device is turned over, elements described as "below" or "beneath" other elements or features would then be oriented "above" the other elements or features. Thus, the term "below" is intended to mean both above and below, depending upon overall device orientation.

Embodiments are described herein with reference to cross-sectional and/or planar illustrations that are schematic illustrations of idealized embodiments and intermediate structures. In the drawings, the sizes and relative sizes of layers and regions may be exaggerated for clarity. Therefore, variations from the shapes of the illustrations as a result, for example, of manufacturing techniques and/or tolerances, are to be expected. Thus, embodiments should not be construed as limited to the particular shapes of regions illustrated herein but are to include deviations in shapes that result, for example, from manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to limit the scope of the present inventive concept.

Terms such as "same," "planar," or "coplanar," as used herein when referring to orientation, layout, location, shapes, sizes, amounts, or other measures do not necessarily mean an exactly identical orientation, layout, location, shape, size, amount, or other measure, but are intended to encompass nearly identical orientation, layout, location, shapes, sizes, amounts, or other measures within acceptable variations that may occur, for example, due to manufacturing processes. The term "substantially" may be used herein to reflect this meaning.

Although the figures described herein may be referred to using language such as "one embodiment," or "certain embodiments," these figures, and their corresponding descriptions are not intended to be mutually exclusive from other figures or descriptions, unless the context so indicates. Therefore, certain aspects from certain figures may be the same as certain features in other figures, and/or certain figures may be different representations or different portions of a particular exemplary embodiment.

As used herein, items described as being "electrically connected" are configured such that an electrical signal can be passed from one item to the other. Therefore, a passive electrically conductive component (e.g., a wire, pad, internal electrical line, etc.) physically connected to a passive electrically insulative component (e.g., a prepreg layer of a printed circuit board, an electrically insulative adhesive connecting two device, an electrically insulative underfill or mold layer, etc.) is not electrically connected to that component. Moreover, items that are "directly electrically connected," to each other are electrically connected through one or more passive elements, such as, for example, wires, pads, internal electrical lines, through vias, etc. As such, directly electrically connected components do not include components electrically connected through active elements, such as transistors or diodes.

The semiconductor devices described herein may be a semiconductor memory chip or semiconductor logic chip, a stack of such chips, a semiconductor package including a package substrate and one or more semiconductor chips, or a package-on-package device. In the case of memory, the semiconductor device may be part of a volatile or non-volatile memory. The plurality of device structures may be integrated in a same electronic device. For example, when a device structure (e.g., a memory cell structure or a transistor structure) is illustrated in a cross-sectional view, an electronic device may include a plurality of the device structures (e.g., memory cell structures or transistor structures), as would be illustrated by a plan view of the electronic device. The plurality of device structures may be arranged in an array and/or in a two-dimensional pattern.

Unless otherwise defined, all terms (including technical and scientific terms) used herein have the same meaning as commonly understood by one of ordinary skill in the art to which this embodiments belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

From among semiconductor integrated circuits (ICs), dynamic random access memory (DRAM) may be connected to a memory controller that receives a request for a read or write operation from a host. The host may include, for example, a user apparatus such as a personal/portable computer, a tablet personal computer (PC), a personal digital assistant (PDA), a portable media player (PMP), a digital camera, a camcorder, or the like. The host may read data stored in the DRAM or store (write) data in the DRAM, by requesting the memory controller for a read or write operation.

If the memory controller receives a request for a read operation, the memory controller issues a read command to the DRAM and expects that valid data will be loaded onto a data bus according to the read command after a number of clock cycles corresponding to read latency (RL). If the memory controller receives a request for a write operation, the memory controller issues a write command to the DRAM and expects that write data, applied to the data bus, will be stored in the DRAM according to the write command after a number of clock cycles corresponding to write latency (WL).

A read operation by the DRAM is performed according to relationships between delay times based on RL of signals along a data output path, and a write operation is performed according to relationships between delay times based on WL of signals along a data input path. Delay times of signals may be determined by taking into account changes in device characteristics caused by process, voltage, or temperature variations (PVT), or the like.

When a p-channel metal-oxide semiconductor (PMOS) transistor is turned on, as an operation temperature increases, an interface trap having a positive (+) electric charge may be generated on an interface of a substrate by a hydrogen ion obtained when a silicon (Si)-hydrogen (H) bond between a Si substrate and a gate oxidation film formed of silicon dioxide ($SiO_2$) is broken. Accordingly, negative biased temperature instability (NTBI) may occur, and a threshold voltage (Vth) of the PMOS transistor may increase. Such a shift in threshold voltage (Vth) may increase as temperature increases, and thus, NBTI may increase as temperature increases.

Similarly, when an n-channel metal-oxide semiconductor (NMOS) transistor is turned on, as an operation temperature increases, an interface trap having a negative (−) electric charge may be generated on an interface of a substrate. Positive biased temperature instability (PBTI) resulting therefrom may increase a threshold voltage (Vth) of the NMOS transistor. Such a shift in threshold voltage (Vth) may increase as temperature increases, and thus, PBTI may increase as temperature increases.

As a scaling of transistors in a semiconductor process and a high frequency operation of transistor are used, the thickness of a gate oxidation film of a transistor may be reduced. In a thin gate oxidation film, an electric field may have a strong effect on the thin gate oxidation film and interface traps may frequently occur. For example, electric charges (positive or negative) of the interface traps may cause a shift in the gate voltage required to reach the threshold condition (i.e., threshold voltage (Vth)). And, as the effect of NBTI/PBTI increases, a shift in threshold voltage (Vth) of a transistor may increase more than expected.

Accordingly, target delay time designed with respect to delay circuits may be changed, and thus, a read or write operation by DRAM may malfunction. According to embodiments, a memory device may include a delay circuit having gate insulation films with thicknesses different from each other so as to reduce an effect of NBTI and PBTI.

FIG. 1 illustrates a diagram showing a memory device 100 that includes delay circuits, according to certain exemplary embodiments.

Referring to FIG. 1, the memory device 100 includes a clock buffer 110, a command buffer 120, a command decoder 130, a latency control circuit 140, a memory cell array 150, a data input circuit 160, and a data output circuit 170. The memory device 100 may be a DRAM, such as, for example, synchronous DRAM (SDRAM), double data rate SDRAM (DDR SDRAM), low power double data rate SDRAM (LPDDR SDRAM), graphics double data rate SDRAM (GDDR SDRAM), DDR2 SDRAM, DDR3 SDRAM, DDR4 SDRAM, or the like.

The clock buffer 110 inputs a clock signal CLK, and thus, generates an internal clock signal ICLK. The internal clock signal ICLK may be provided to various circuit blocks in the memory device 100. For examples, the internal clock signal ICLK may be provided to the command decoder 130 and the latency control circuit 140.

The command buffer 120 may receive as inputs command signals CMD, such as, for example, a clock enable signal CKE, a chip selection signal (/CS), a low address strobe signal (/RAS), a column address strobe signal (/CAS), a write enable signal (/WE), etc., and output the command signals CMD to the command decoder 130.

The command decoder 130 decodes the command signals CMD, and generates control signals corresponding to the command signals CMD. The command decoder 130 may generate a read signal RD corresponding to a read command signal CMD, and generate a write signal WR corresponding to a write command signal CMD. The read signal RD is a signal for controlling a read operation by the memory device 100, and may be provided to various circuit blocks in the memory device 100. The write signal WR is a signal for controlling a write operation by the memory device 100, and may be provided to various circuit blocks in the memory device 100.

The read signal RD and the write signal WR are generated by the command decoder 130 and provided to the latency control circuit 140, and may function as signals for supporting RL or WL, which are specified in a standard specification of the memory device 100.

The latency control circuit 140 delays the read signal RD or the write signal WR in response to the internal clock signal ICLK provided by the clock buffer 100, and outputs a latency control signal LATENCY. The latency control circuit 140 may include a first delay circuit 142 for delaying the read signal RD or the write signal WR in response to the internal clock signal ICLK.

With respect to the WL, the first delay circuit 142 may generate the latency control signal LATENCY by compensating in advance for the amount of delay required for the internal clock signal ICLK to reach the data input circuit 160, for example, the amount of delay along a data input path. With respect to the RL, the first delay circuit 142 may generate the latency control signal LATENCY by compensating in advance for the amount of delay required for the internal clock signal ICLK to reach the data output circuit 170, that is, the amount of delay along a data output path. The latency control signal LATENCY may be provided to the data input circuit 160 or the data output circuit 170.

The memory cell array 150 may include a plurality of memory cells which are arranged in rows and columns. Each memory cell may include an access transistor and a storage capacitor. Memory cells may be arranged such that a memory cell intersects with each intersection point in a matrix consisting of word lines and bit lines. For example, a memory cell may be disposed at each point of intersection between the word lines and the bit lines. Data, provided by a memory controller located outside the memory device 100, may be written to the memory cells in the memory cell array 150.

According to an embodiment, the memory cell array 150 may be configured as a three-dimensional (3D) memory array. The 3D memory array is monolithically formed as one or more physical levels of arrays of memory cells having an active area, which is disposed above a silicon substrate, and a circuit, which is associated with operation of the memory cells and formed on or in the silicon substrate. The term "monolithic" means that layers of each level of an array are directly stacked on layers of each underlying level of the array.

U.S. Pat. No. 7,679,133, U.S. Pat. No. 8,553,466, U.S. Pat. No. 8,654,587, U.S. Pat. No. 8,559,235, and U.S. Patent Application Publication No. 2011/0233648 provide exemplary configurations in which 3D memory arrays are formed in a plurality of levels, and word lines and/or bit lines are shared between the plurality of levels. The entire disclosures of each of U.S. Pat. No. 7,679,133, U.S. Pat. No. 8,553,466, U.S. Pat. No. 8,654,587, U.S. Pat. No. 8,559,235, and U.S. Patent Application Publication No. 2011/0233648 are incorporated herein by references in their entireties.

The data input circuit 160 may align and latch write data, input via a data bus DQ, in response to a latency control signal LATENCY, and thus, provide the write data to the memory cell array 150 as internal write data DIN. The data input circuit 160 may include a data input buffer (not illustrated) and a data strobe buffer (not illustrated), and the data input buffer and the data strobe buffer may respectively include a second delay circuit 162. The second delay circuit 162 may delay write data, and output internal write data DIN. In some embodiments, the second delay circuit 162 may delay write data, and output internal write data DIN based on the latency control signal LATENCY.

The data output circuit 170 may output read data DOUT in the memory device 100 to the data bus DQ in response to the latency control signal LATENCY. The data output circuit 170 may include a data output buffer (not illustrated) and a data strobe buffer (not illustrated), and the data output buffer and the data strobe buffer may respectively include a third delay circuit 172. The third delay circuit 172 may delay the read data DOUT, and output the read data DOUT to the data bus DQ as output data. In some embodiments, the third delay circuit 172 may delay the read data DOUT, and output the read data DOUT based on the latency control signal LATENCY.

In the current embodiment, for convenience of description, the first through third delay circuits 142, 162, and 172 are described as being included in, respectively, the latency control circuit 140, the data input circuit 160, and the data output circuit 170. However, according to embodiments, delay circuits may be included in various circuit blocks in the memory device 100.

Figure 2:
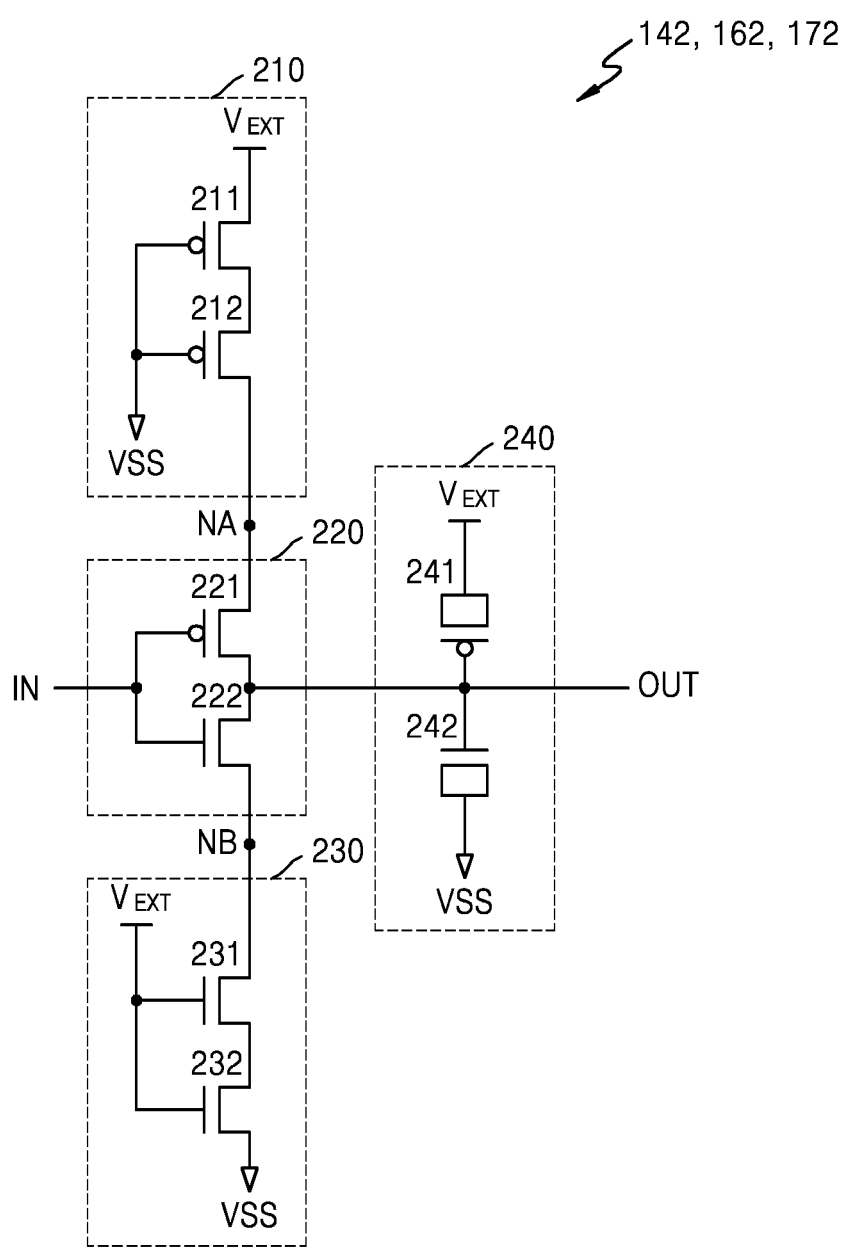
FIG. 2 is a circuit diagram for explaining the exemplary delay circuits shown in FIG. 1.

FIG. 2 is a circuit diagram for explaining the delay circuits 142, 162, and 172 shown in FIG. 1, consistent with certain disclosed embodiments.

Referring to FIG. 2, each of the delay circuits 142, 162, and 172 may receive as input an input signal IN and may output an output signal OUT. The delay circuits 142, 162, and 172 invert the input signal IN and output the output signal OUT, and delay time of the output signal OUT may be determined according to transition time of the output signal OUT. Delay time of the output signal OUT with respect to each of the delay circuits 142, 162, and 172 may be determined as target delay time appropriate for operation of circuits included in the delay circuits 142, 162, and 172. Each of the delay circuits 142, 162, and 172 may include circuit components such as, for example, a first resistor 210, an inverter 220, a second resistor 230, and a loader 240.

The first resistor may include a first set of one or more transistors connected between a source of a power voltage and a first node. For example, the first resistor 210 may include first and second PMOS transistors 211 and 212 which are serially connected between a source of power voltage $V_{EXT}$ and a first node NA. Gates of the first and second PMOS transistors 211 and 212 may be connected to a ground voltage VSS. In the current embodiment, a case when the first resistor 210 includes the two PMOS transistors 211 and 212 is described as an example. However, according to embodiments, the number of PMOS transistors included in the first resistor 210 may vary.

The second resistor may include a second set of one or more transistors connected between the second node and a ground voltage. For example, the second resistor 230 may include first and second NMOS transistors 231 and 232 which are serially connected between a second node NB and the ground voltage VSS. Gates of the first and second NMOS transistors 231 and 232 may be connected to the source of the power voltage $V_{EXT}$. In the current embodiment, a case when the second resistor 230 includes the two NMOS transistors 231 and 232 is described as an example. However, according to embodiments, the number of NMOS transistors included in the second resistor 230 may vary.

The inverter may include a third set of one or more transistors connected between the first node and the second node, and the inverter may be configured to receive an input signal, invert the input signal, and output the inverted input signal as an output signal. For example, the inverter 220 may include a third PMOS transistor 221 and a third NMOS transistors 222 which are serially connected between the first node NA and the second node NB. Gates of the third PMOS and NMOS transistors 221 and 222 may be connected to the input signal IN, and drains thereof may be connected to the output signal OUT. For example, gates of the third PMOS and NMOS transistors 221 and 222 may be connected in parallel to the input signal IN, and drains thereof may be connected in parallel to the output signal OUT.

The loader 240 may include first and second capacitors 241 and 242 for controlling transition time of the output signal OUT. The first capacitor 241 may be implemented as a PMOS transistor, and the output signal OUT may be connected to a gate of the PMOS transistor, and the source of the power voltage $V_{EXT}$ may be connected to a drain and a source of the PMOS transistor. The second capacitor 242 may be implemented as an NMOS transistor, and the output signal OUT may be connected to a gate of the NMOS transistor, and a ground voltage VSS may be connected to a drain and a source of the NMOS transistor.

The PMOS and NMOS transistors constituting the delay circuits 142, 162, and 172 may be formed to have gate insulation films with thicknesses different from each other. For example, the PMOS and NMOS transistors constituting the delay circuits 142, 162, and 172 may be formed to have gate insulation films with thicknesses different from one or more other PMOS and NMOS transistors constituting the delay circuits 142, 162, and 172. According to embodiments, transistor are classified into transistors having a thin gate insulation film and transistors having a thick gate insulation film, and the thick gate insulation film may be, for example, an insulation film having a greatest thickness within any of the delay circuits 142, 162, and 172. According to embodiments, the PMOS and NMOS transistors of the delay circuits 142, 162, and 172 may be formed of gate insulation films having various thicknesses.

Figure 3A:
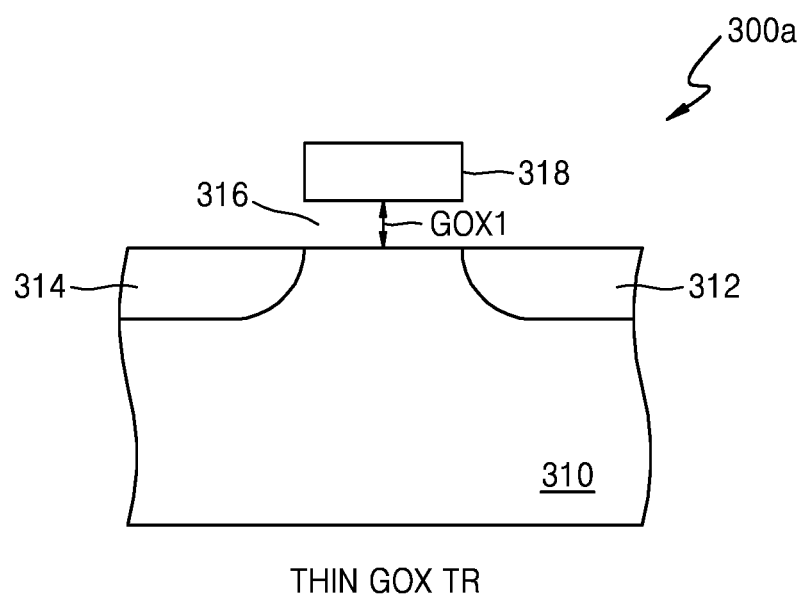
FIGS. 3A and 3B are diagrams for explaining metal-oxide semiconductor (MOS) transistors, according to certain exemplary embodiments.
Figure 3B:
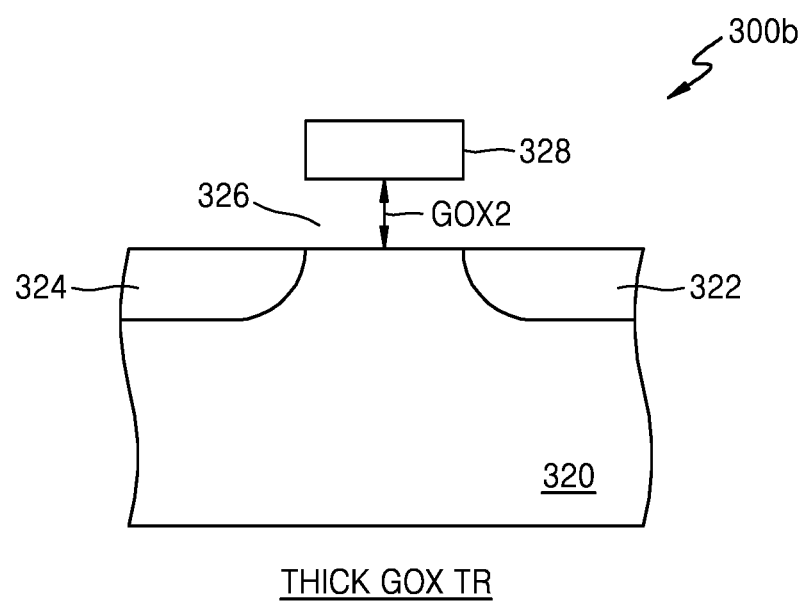

FIGS. 3A and 3B illustrate diagrams for explaining MOS transistors, according to certain exemplary embodiments. FIG. 3A is a cross-sectional view of an MOS transistor 300a having a thin gate insulation film (labeled as "Thin GOX Tr"), and FIG. 3B is a cross-sectional view of an MOS transistor 300b having a thick gate insulation film (labeled as "Thick GOX Tr").

Referring to FIG. 3A, in the MOS transistor 300a having a thin gate insulation film, high-concentration impurity areas 312 and 314 are formed on a surface of a semiconductor substrate 310, and a gate insulation film 316 and a gate electrode 318 are formed on a channel area between the high-concentration impurity areas 312 and 314.

The semiconductor substrate 310 may include a semiconductor such as Si or germanium (Ge), or a compound semiconductor such as silicon germanium (SiGe), silicon carbide (SiC), gallium arsenide (GaAs), indium arsenide (InAs), or indium phosphide (InP). The semiconductor substrate 310 may have a silicon on insulator (SOI) structure, and include a well doped with an impurity or a structure doped with an impurity.

P-type high-concentration impurity areas 312 and 314 formed of a group III material formed on an N-type semiconductor substrate 310, which may be formed of a group V material, may form a source/drain area of a PMOS transistor. N-type high-concentration impurity areas 312 and 314 formed on a P-type semiconductor 310 may form a source/drain area of an NMOS transistor.

The gate insulation film 316 may be formed to have a first thickness GOX1. The gate insulation film 316 may be formed of an insulation material, such as, for example, an oxide film, a nitride film, an oxynitride film, a high-k dielectric film, etc. The first thickness GOX1 may be the distance between a lower surface of the gate electrode 318 and an upper surface of the substrate 310 between the N-type high-concentration impurity areas 312 and 314.

Referring to FIG. 3B, in an MOS transistor 300b having a thick gate insulation film, high-concentration impurity areas 322 and 324 are formed on a surface of a semiconductor substrate 320, and a gate insulation film 326 and a gate electrode 328 are formed on a channel area between the high-concentration impurity areas 322 and 324. The gate insulation film 326 may be formed to have a second thickness GOX2 that is greater than the first thickness GOX1 of the gate insulation film 316. The gate insulation film 326 may be formed of an insulation material, such as, for example, an oxide film, a nitride film, an oxynitride film, a high-k dielectric film, etc. The second thickness GOX2 may be the distance between a lower surface of the gate electrode 328 and an upper surface of the substrate 320 between the P-type high-concentration impurity areas 322 and 324. In some embodiments, a thickness ratio between a thin gate insulation film GOX1 and a thick gate insulation film GOX2 is 1:3. For example, the thickness of the thick gate insulation film GOX2 may be three times the thickness of the thin gate insulation film GOX1.

The high-k dielectric film constituting the gate insulation films 316 and 326 may be formed of a material having a greater dielectric constant that that of a silicon oxide film. For example, a high-k dielectric film may have a dielectric constant of about 10 to 25. The high-k dielectric film may be formed of a material selected from zirconium oxide, zirconium silicon oxide, hafnium oxide, hafnium oxynitride, hafnium silicon oxide, tantalum oxide, titanium oxide, barium strontium titanium oxide, barium titanium oxide, strontium titanium oxide, yttrium oxide, aluminum oxide, lead scandium tantalum oxide, lead zinc niobate, and a combination thereof. However, a material constituting a high-k dielectric film is not limited thereto.

The transistor 300a shown in FIG. 3A and having a thin gate insulation film 316 and the transistor 300b shown in FIG. 3B and having a thick gate insulation film 326 may be employed in the first through third delay circuits 142, 162, and 172 shown in FIG. 2. For convenience of description, with respect to the first delay circuit 142 from among the first through third delay circuits 142, 162, and 172, the transistor 300a having a thin gate insulation film is marked as GOX1, and the transistor 300b having a thick gate insulation film is marked with GOX2.

In a case where a gate insulation film of a high-k dielectric film has a thickness less than that of a silicon oxide film, the gate insulation film may be immune to an NBTI/PBTI effect. However, when a silicon oxide film is used, NBTI/PBTI effects may occur. Therefore, according to some embodiments, delay circuits that have various configurations and are implemented as GOX1 and GOX2 based on a silicon oxide film are described with reference to FIGS. 4 through 12.

FIGS. 4 through 12 illustrate diagrams for explaining delay circuits 142a through 142i, according to certain exemplary embodiments.

Figure 4:
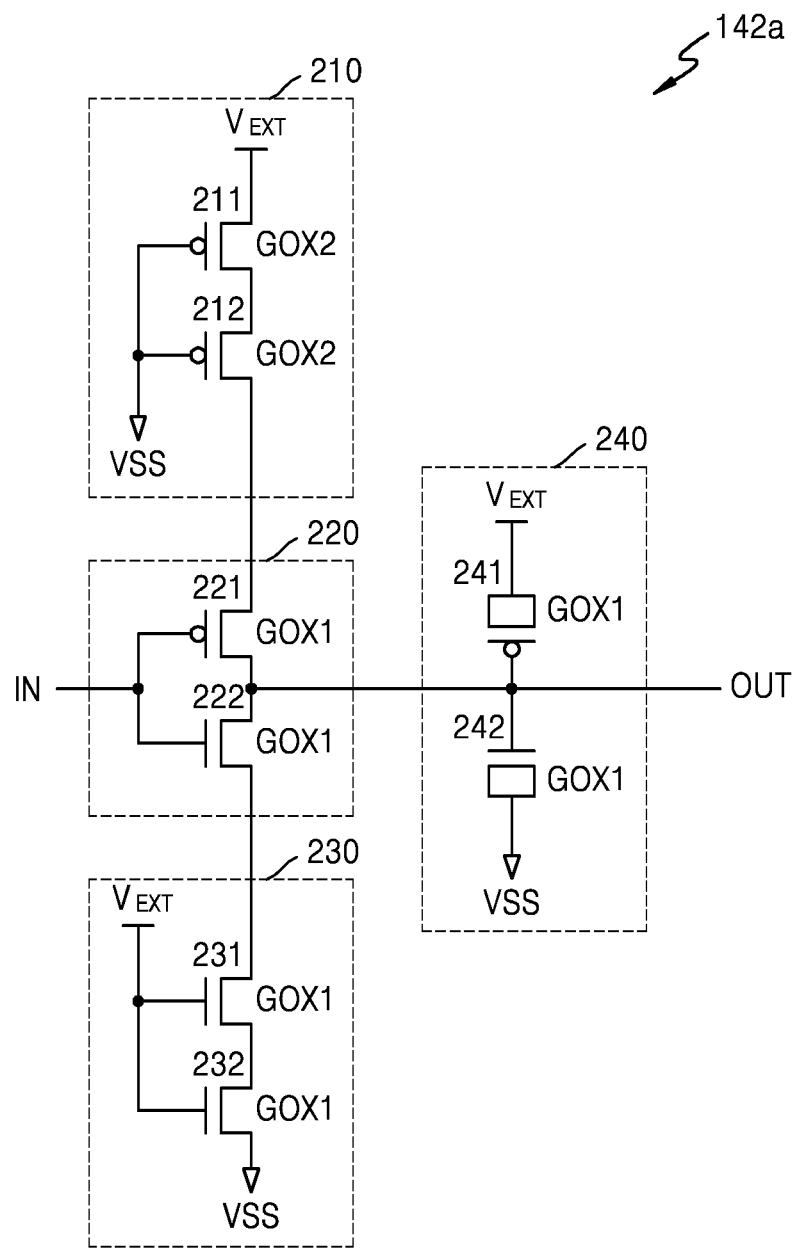
FIGS. 4 through 12 are diagrams for explaining delay circuits, according to certain exemplary embodiments.

Referring to FIG. 4, in the delay circuit 142a, the PMOS transistors 211 and 212 in the first resistor 210 may include transistors GOX2 having a thick gate insulation film. In the delay circuit 142a, the PMOS and NMOS transistors 221, 222, 231, and 232, included in the inverter 220 and the second resistor 230, and the capacitors 241 and 242 included in the loader 240 may consist of the transistors GOX1 having a thin gate insulation film.

Figure 5:
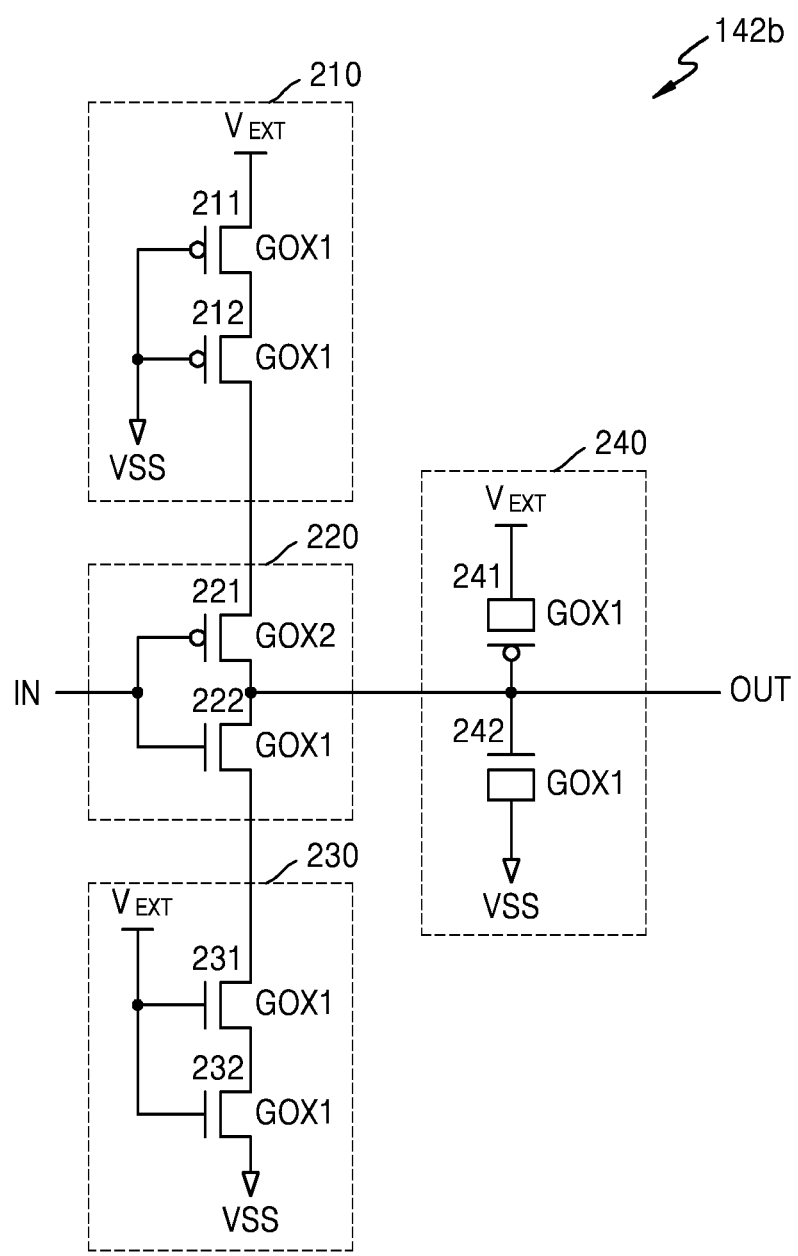

Referring to FIG. 5, in the delay circuit 142b, the PMOS transistor 221 in the inverter 220 may include transistors GOX2 having a thick gate insulation film. In the delay circuit 142b, the NMOS transistor 222 included in the inverter 220, the PMOS and NMOS transistors 211, 212, 231, and 232 included in the first and second resistors 210 and 230, and the capacitors 241 and 242 included in the loader 240 may consist of the transistors GOX1 having a thin gate insulation film.

Figure 6:
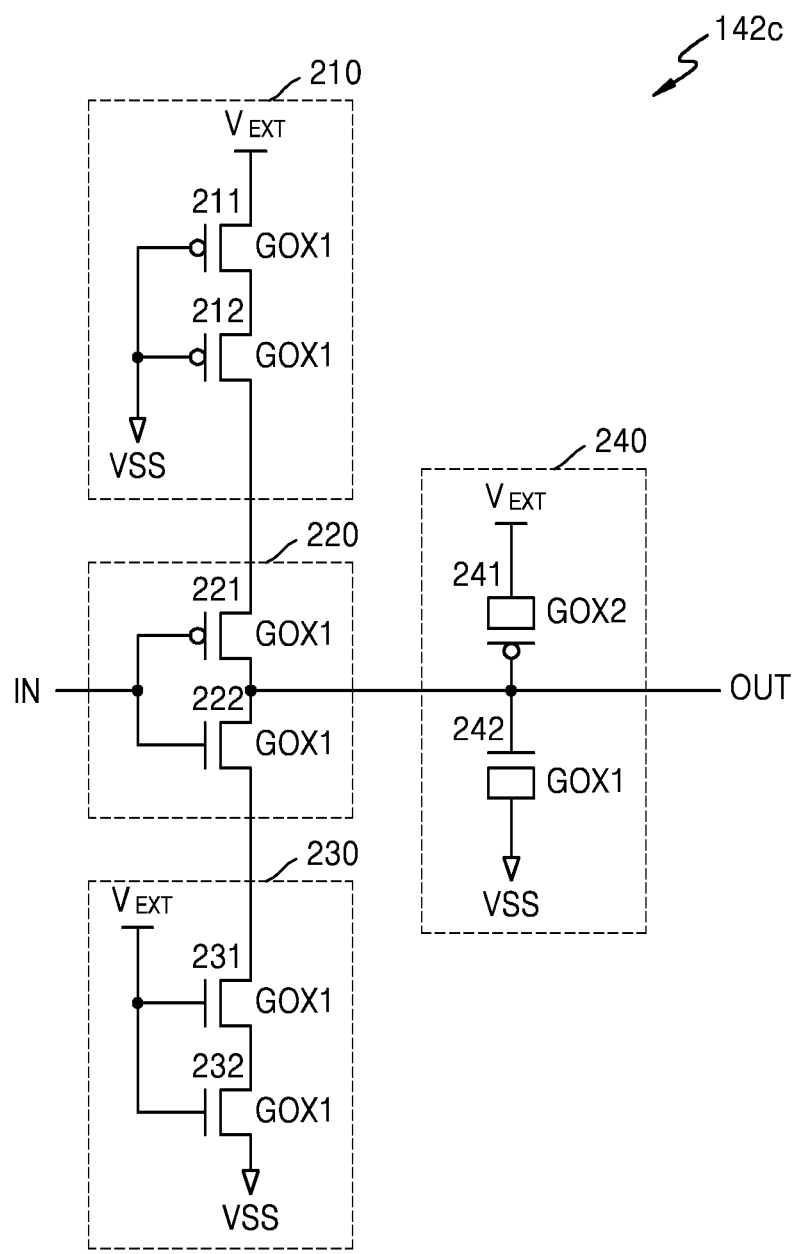

Referring to FIG. 6, in the delay circuit 142c, the capacitor 241 in the loader 240 may include transistors GOX2 having a thick gate insulation film. In the delay circuit 142c, the PMOS and NMOS transistors 211, 212, 221, 222, 231, and 232, included in the first and second resistors 210 and 230 and the inverter 220, and the capacitor 242 included in the loader 240 may consist of the transistors GOX1 having a thin gate insulation film.

Figure 7:
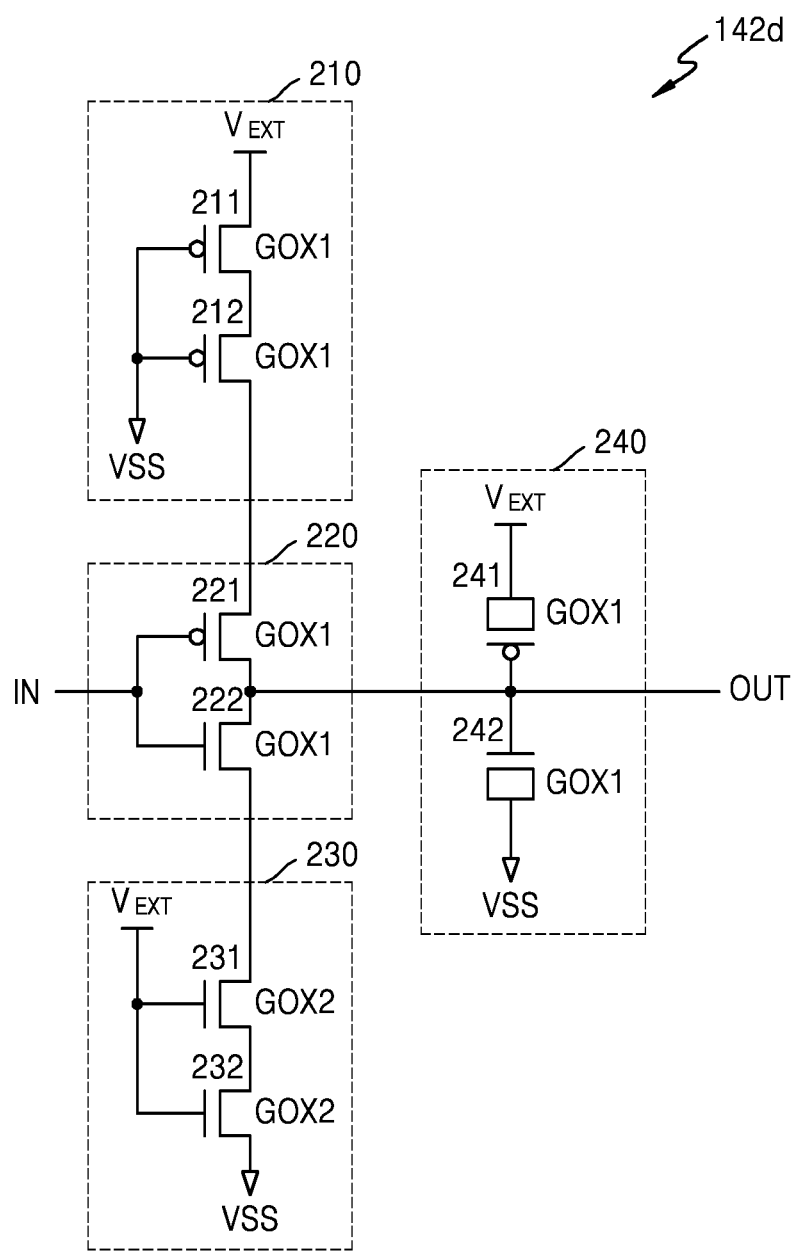

Referring to FIG. 7, in the delay circuit 142d, the NMOS transistors 231 and 232 included in the second resistor 230 may include the transistors GOX2 having a thick gate insulation film. In the delay circuit 142d, the PMOS and NMOS transistors 211, 212, 221, and 222, included in the first resistor 210 and the inverter 220, and the capacitors 241 and 242 included in the loader 240 may consist of the transistors GOX1 having a thin gate insulation film.

Figure 8:
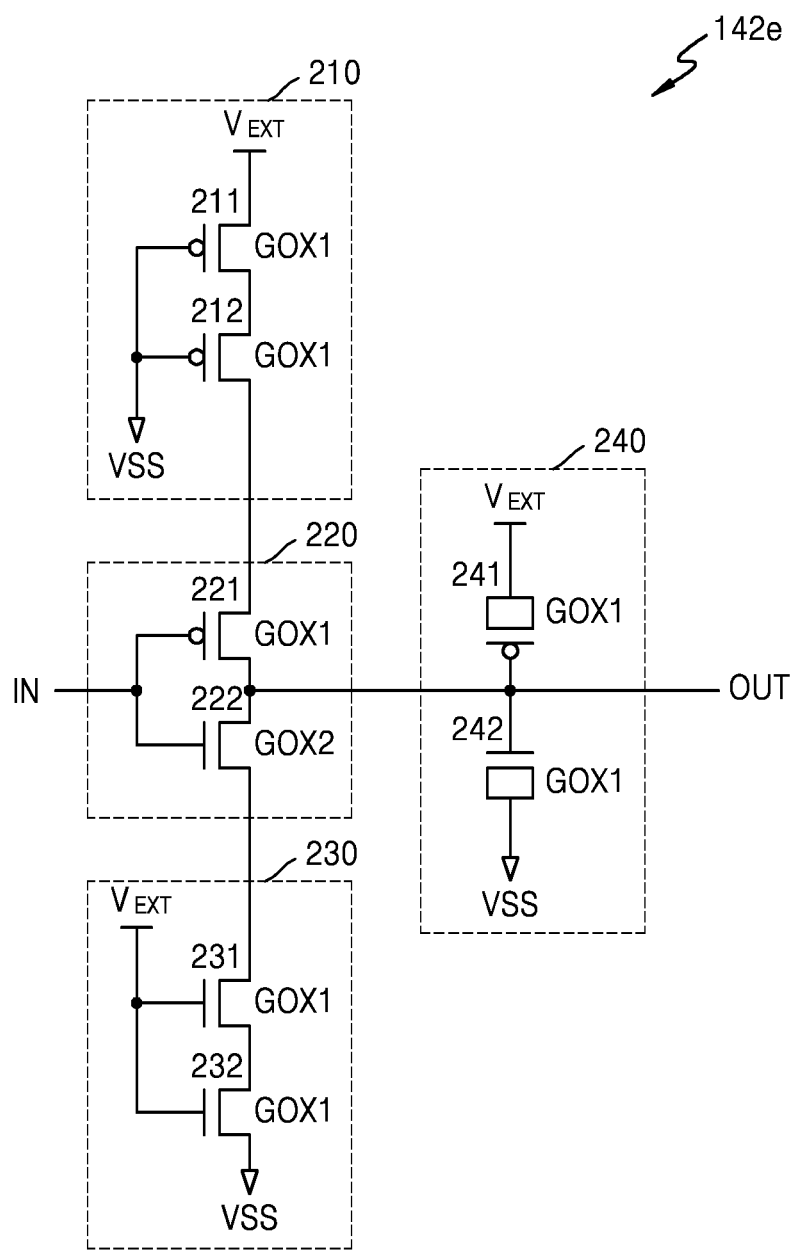

Referring to FIG. 8, in the delay circuit 142e, the NMOS transistor 222 included in the inverter 220 may include the transistor GOX2 having a thick gate insulation film. In the delay circuit 142e, the PMOS transistor 221 included in the inverter 220, the PMOS and NMOS transistors 211, 212, 231, and 232 included in the first and second resistors 210 and 230, and the capacitors 241 and 242 included in the loader 240 may consist of the transistors GOX1 having a thin gate insulation film.

Figure 9:
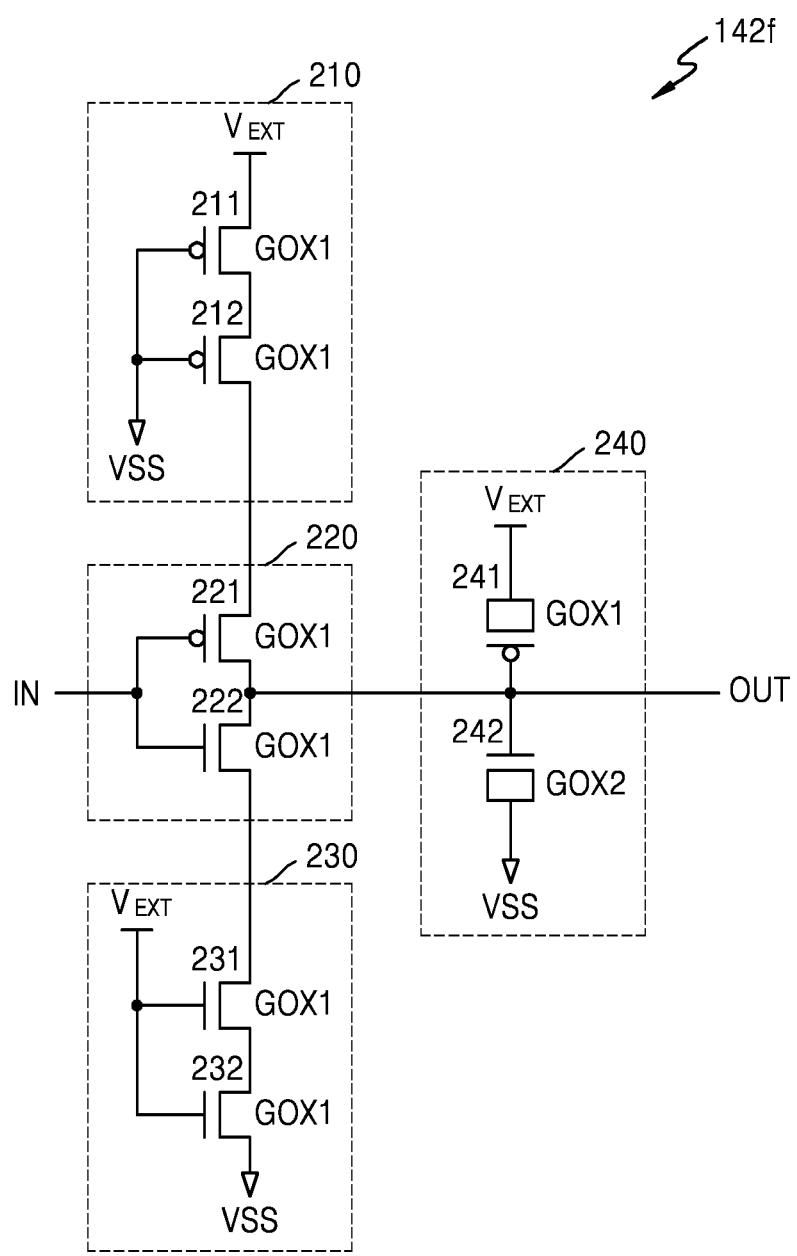

Referring to FIG. 9, in the delay circuit 142f, the capacitor 242 included in the loader 240 may include the transistor GOX2 having a thick gate insulation film. In the delay circuit 142f, the PMOS and NMOS transistors 211, 212, 221, 222, 231, and 232, included in the first and second resistors 210 and 230 and the inverter 220, and the capacitor 241 included in the loader 240 may consist of the transistors GOX1 having a thin gate insulation film.

Figure 10:
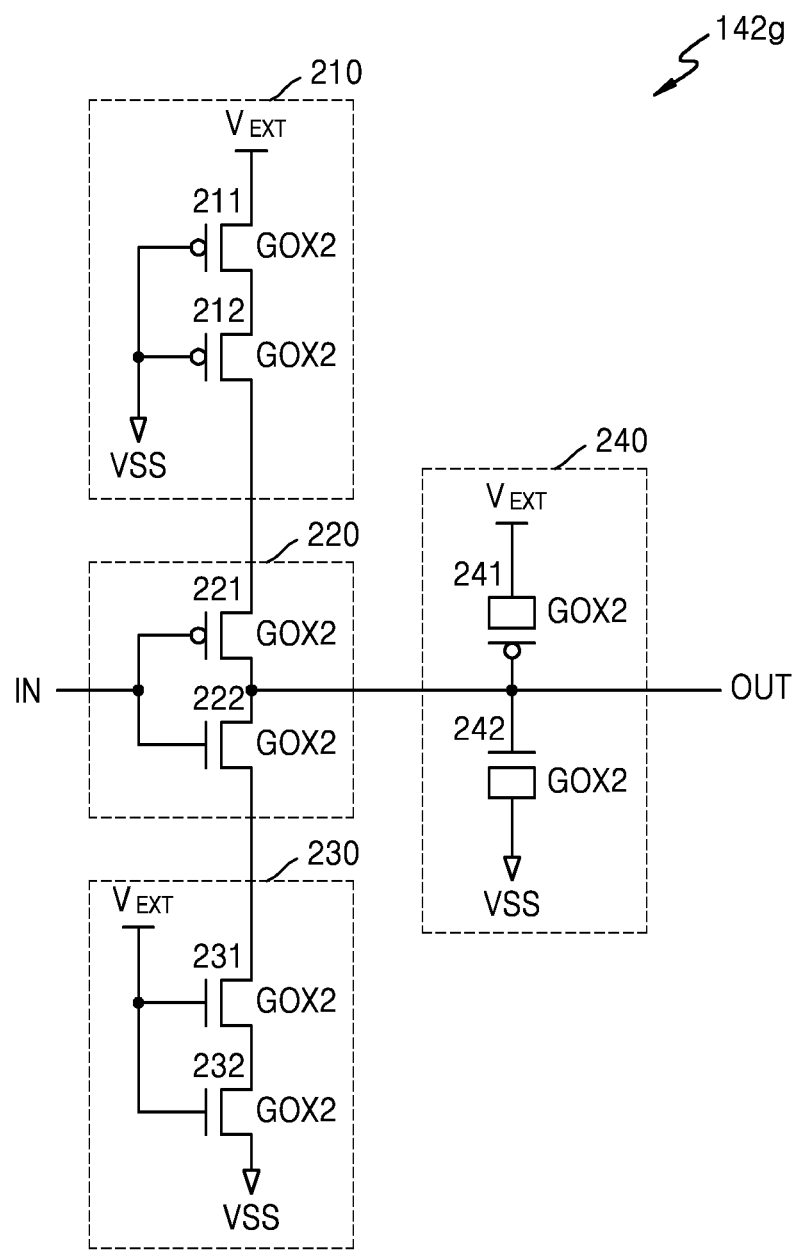

Referring to FIG. 10, in the delay circuit 142g, the PMOS and NMOS transistors 211, 212, 221, 222, 231, and 232 included in the first and second resistors 210 and 230 and the inverter 220, and the capacitors 241 and 242 included in the loader 240 may consist of the transistors GOX2 having a thick gate insulation film.

Figure 11:
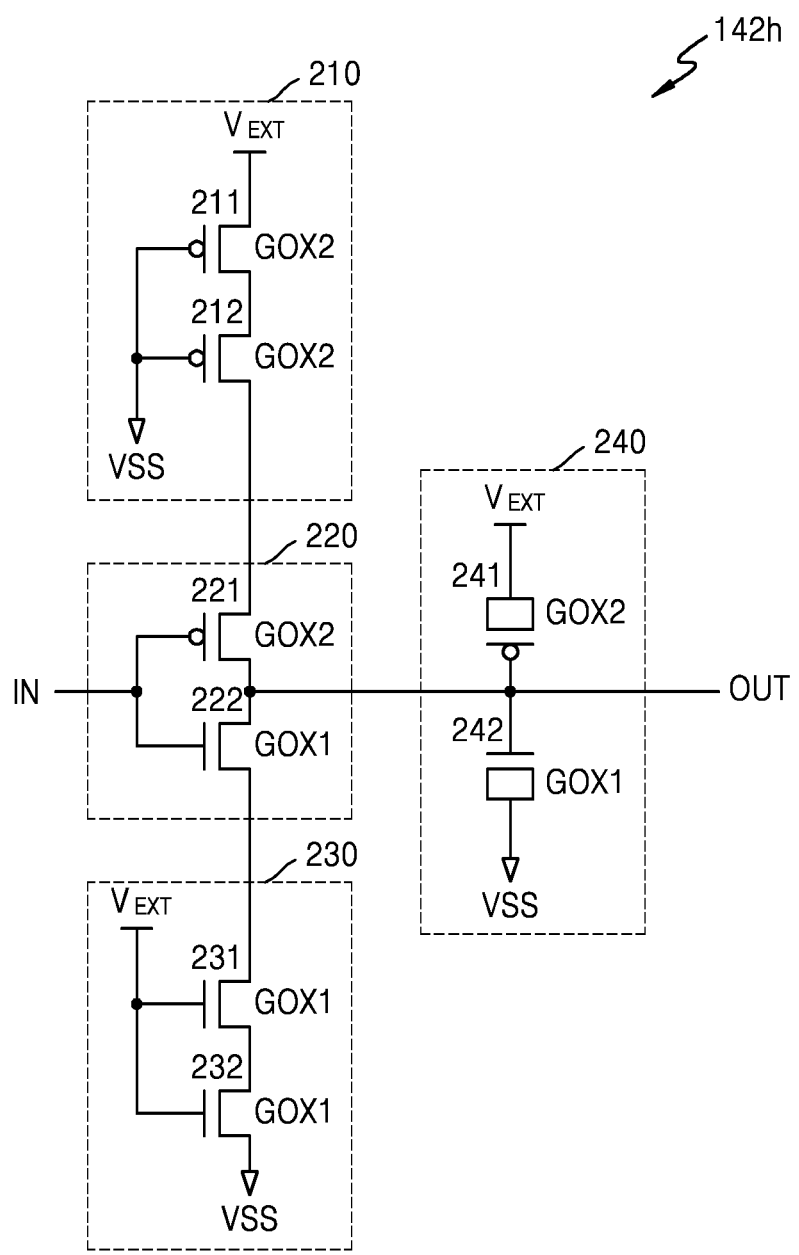

Referring to FIG. 11, in the delay circuit 142h, the PMOS transistors 211 and 212 included in the first resistor 210, the PMOS transistor 221 included in the inverter 220, and the capacitor 241 included in the loader 240 may consist of the transistors GOX2 having a thick gate insulation film. In the delay circuit 142h, the NMOS transistors 231 and 232 included in the second resistor 230, the PMOS transistor 222 included in the inverter 220, and the capacitor 242 included in the loader 240 may consist of the transistors GOX1 having a thin gate insulation film.

Figure 12:
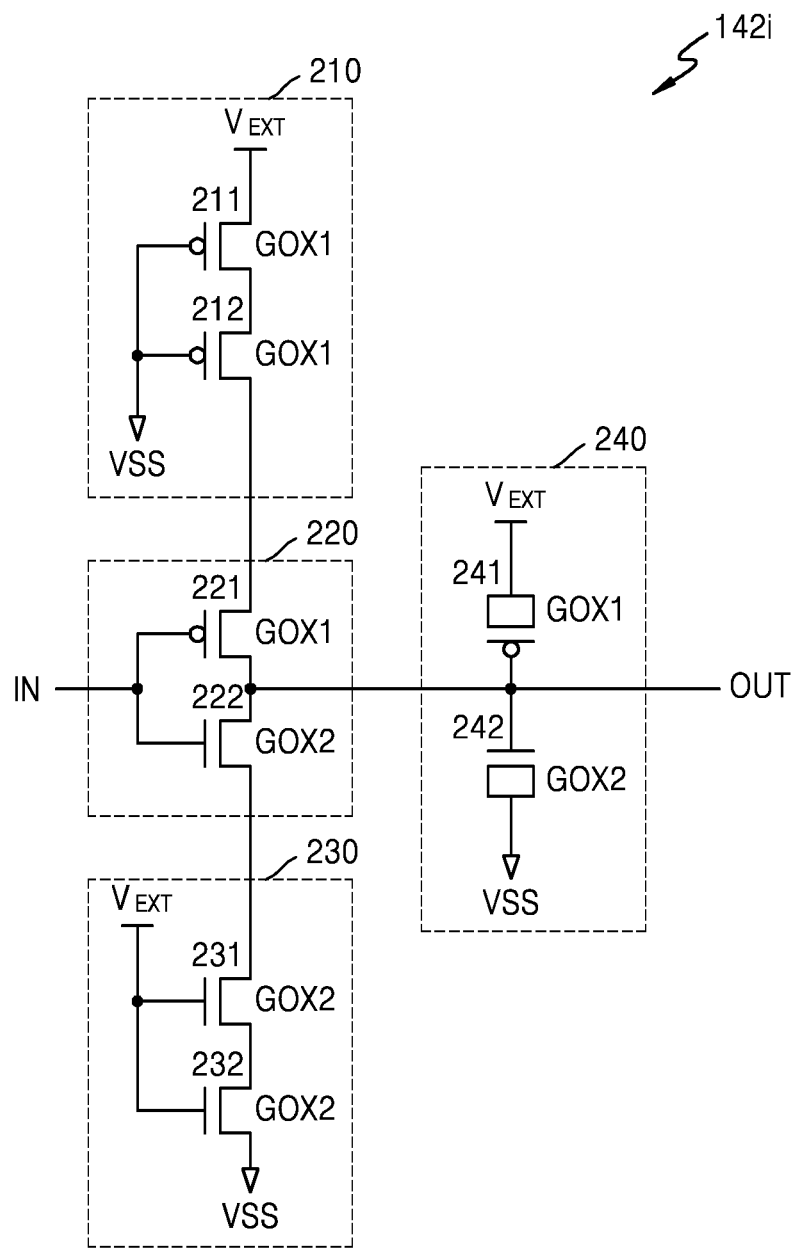

Referring to FIG. 12, in the delay circuit 142i, the NMOS transistors 231 and 232 included in the second resistor 230, the PMOS transistor 222 included in the inverter 220, and the capacitor 242 included in the loader 240 may consist of the transistors GOX2 having a thick gate insulation film. In the delay circuit 142i, the PMOS transistors 211 and 212 included in the first resistor 210, the PMOS transistor 221 included in the inverter 220, and the capacitor 241 included in the loader 240 may consist of the transistors GOX1 having a thin gate insulation film.

As described above, the delay circuits 142a through 142i may selectively use a transistor GOX2 having a thick gate insulation film so as to reduce NBTI and PBTI, which affect a thin gate insulation film more than a thick gate insulation film. In the transistor GOX2 having a thick gate insulation film, a thickness of the gate insulation film may be determined so as to minimize the effect of NBTI or PBTI. For example, one or more transistors GOX2 having a thick gate insulation film may be determined to be those with gate insulation films having a greatest thickness or thicknesses in the delay circuits 142a through 142i. Accordingly, an effect of a shift in a threshold voltage according to NBTI and PBTI on the delay circuits 142a through 142i may be reduced, and thus, target delay time may be achieved.

Figure 13:
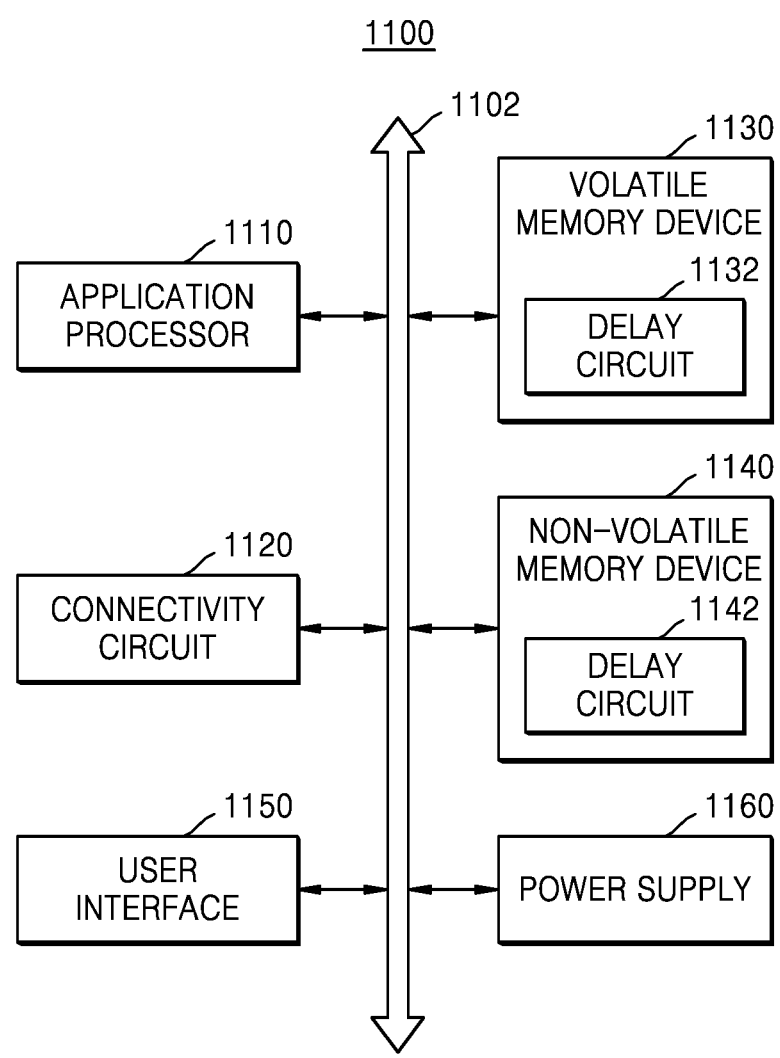
FIG. 13 is a block diagram showing an example of applying a memory device, which includes a delay circuit, to a mobile system, according to certain exemplary embodiments.

FIG. 13 is a block diagram showing an example of memory devices 1130 and 1140, which include a delay circuit, in a mobile system 1100, according to certain exemplary embodiments.

Referring to FIG. 13, the mobile system 1100 may include an application processor 1110, a connectivity circuit 1120, a first memory device 1130, a second memory device 1140, a user interface 1150, and a power supplier 1160 which are connected to each other via a bus 1102. In some embodiments, the first memory device 1130 may be configured as a volatile memory device, and the second memory device 1140 may be configured as a non-volatile memory device.

According to embodiments, the mobile system 1100 may be any type of mobile system, such as, for example, a mobile phone, a smartphone, a personal digital assistant (PDA), a portable multimedia player (PMP), a digital camera, a music player, a portable game console, a navigation system, or the like.

The application processor 1110 may execute applications providing an internet browser, a game, a moving image, or the like. According to embodiments, the application processor 1110 may include a single core or multiple cores. For example, the application processor 1110 may be a dual-core, quad-core, or hexa-core processor. According to embodiments, the application processor 1110 may further include a cache memory located inside or outside the application processor 1110.

The connectivity circuit 1120 may perform wired or wireless communication with an external apparatus. For example, the connectivity circuit 1120 may perform Ethernet communication, near-field communication (NFC), radio frequency identification (RFID), mobile telecommunication, memory card communication, universal serial bus (USB) communication, or the like. For example, the connectivity circuit 1120 may include a baseband chipset, and support wireless communication protocols such as GSM, GRPS, WCDMA, HSxPA, or the like.

The first memory device 1130 is a volatile memory device, and may store data processed by the application processor 1110 as write data, or operate as a working memory. The first memory device 1130 includes a delay circuit 1132 for delaying and outputting signals for controlling an operation of reading or writing memory cell data. One or more of the transistors constituting the delay circuit 1132 may have a gate insulation film having an increased thickness for minimizing the effect of NBTI or PBTI. The shift in threshold voltage due to NTBI or PBTI for the one or more transistors having an increased thickness may be reduced, and thus, the delay circuit 1132 may achieve a target delay time and prevent malfunction of the first memory device 1130.

The second memory device 1140 is a non-volatile memory device, and may store a boot image for booting the mobile system 1100. For example, the non-volatile memory device 1140 may be implemented as an electrically erasable programmable read-only memory (EEPROM), flash memory, phase change random access memory (PRAM), resistance random access memory (RRAM), nano floating gate memory (NFGM), polymer random access memory (PoRAM), magnetic random access memory (MRAM), ferroelectric random access memory (FRAM), or the like.

The second memory device 1140 includes a delay circuit 1142 for delaying and outputting signals for controlling an operation of reading or writing memory cell data. One or more of the transistors constituting the delay circuit 1142 has a gate insulation film having an increased thickness (compared to other of the transistors) that may minimize an effect of NBTI or PBTI. The shift in threshold voltage due to NTBI or PBTI for the one or more transistors having an increased thickness may be reduced, and thus, the delay circuit 1142 may achieve target delay time and prevent malfunction of the second memory device 1140.

The user interface 1150 may include one or more input apparatuses such as a keypad or a touchscreen and/or one or more output apparatuses such as a speaker or a display apparatus. The power supplier 1160 may supply an operating voltage to the mobile system 1100. Additionally, according to embodiments, the mobile system 1100 may further include a camera image processor (CIP), and further include a storage apparatus such as a memory card, a solid state drive (SSD), a hard disk drive (HDD), a compact disk-read only memory (CD-ROM), or the like.

Figure 14:
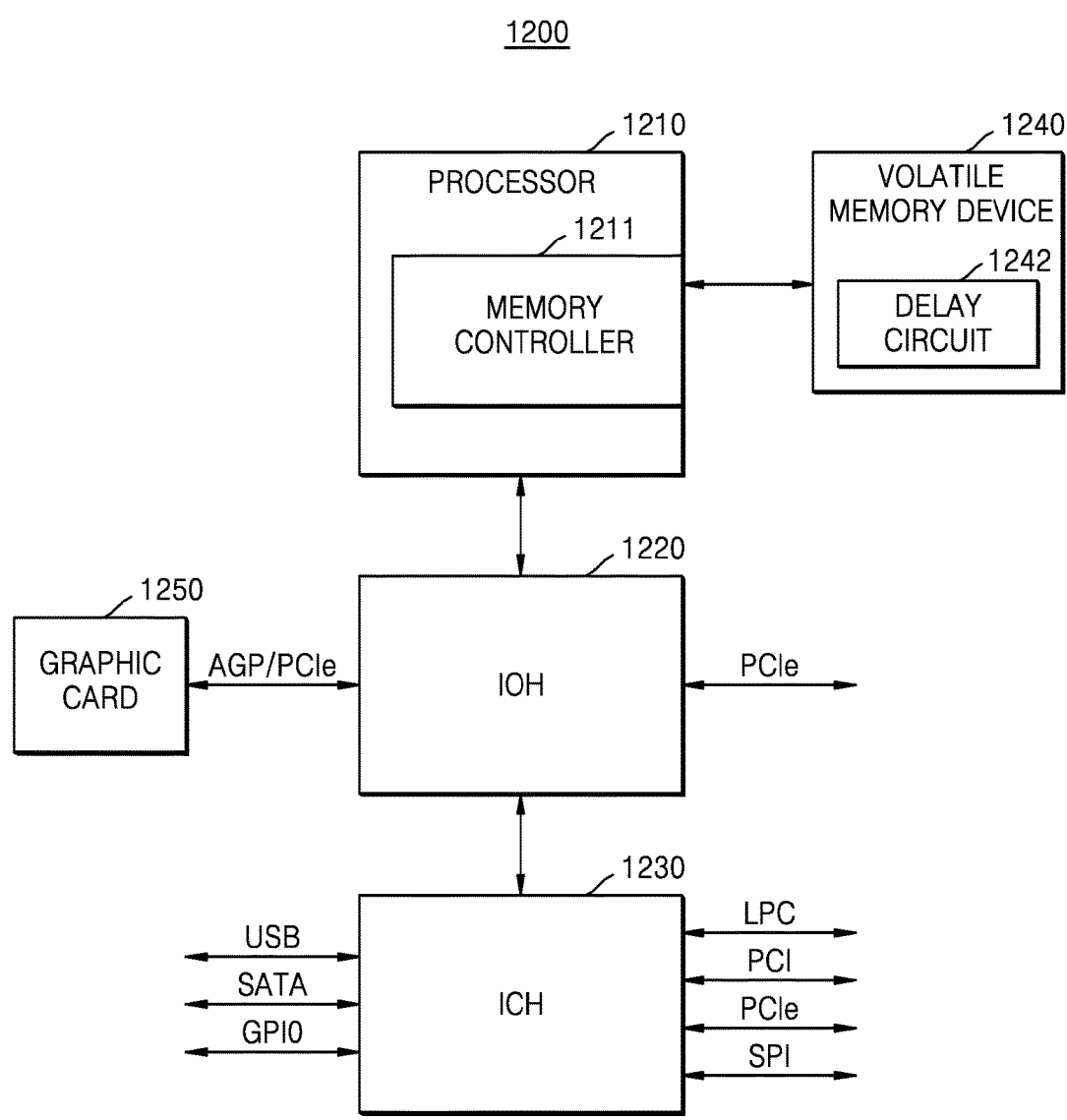
FIG. 14 is a block diagram showing an example of applying a memory device, which includes a delay circuit, to a computing system, according to certain exemplary embodiments.

FIG. 14 is a block diagram showing an example of a memory device 1240, which includes a delay circuit, in a computing system 1200, according to certain exemplary embodiments.

Referring to FIG. 14, the computing system 1200 includes a processor 1210, an input/output hub (IOH) 1220, an input/output controller hub (ICH) 1230, the memory device 1240, and a graphic card 1250. According to embodiments, the computer system 1200 may be any type of computing system, such as, for example, a personal computer (PC), a server computer, a workstation, a laptop computer, a mobile phone, a smartphone, a PDA, a PMP, a digital camera, a digital TV, a set-top box, a music player, a portable game console, a navigation system, or the like.

The processor 1210 may perform various computing functions such as particular calculation or tasks. For example, the processor 1210 may be a microprocessor or a central processing unit (CPU). According to embodiments, the processor 1210 may include a single core or multiple cores. For example, the processor 1210 may include a dual-core, quad-core, or hexa-core processor, or the like. FIG. 14 shows the computing system 1200 that includes a single processor 1210. However, according to embodiments, the computing system 1200 may include a plurality of processors 1210. Additionally, according to embodiments, the processor 1210 may further include a cache memory located inside or outside the processor 1210.

The processor 1210 may include a memory controller 1211 for controlling an operation of the memory device 1240. The memory controller 1211 included in the processor 1210 may be referred to as an integrated memory controller (IMC). In some embodiments, the memory controller 1211 may be located in the input/output hub 1220. When the input/output hub 1220 includes the memory controller 1211, the input/output hub 1220 may be referred to as a memory controller hub (MCH).

The memory device 1240 includes a delay circuit 1242 for delaying and outputting signals for controlling an operation of reading or writing memory cell data. One or more of the transistors constituting the delay circuit 1242 may have a gate insulation film of a thickness sufficient to minimize an effect of NBTI or PBTI. The delay circuit 1242 may be affected little by a shift in a threshold voltage that may be caused by NTBI or PBTI, and thus, the delay circuit 1242 may achieve target delay time and prevent malfunction of the memory device 1240.

The input/output hub 1220 may manage data transmission between the processor 1210 and apparatuses or circuits, such as, for example, the graphic card 1250. The input/output hub 1220 may be connected to the processor 1210 via various types of interfaces. For example, the input/output hub 1220 and the processor 1210 may be connected to each other via various standards of interfaces such as a front side bus (FSB), a system bus, HyperTransport, lightning data transport (LDT), quickpath interconnect (QPI), a common system interface, peripheral component interface-Express (CSI), or the like. FIG. 14 shows the computing system 1200 that includes a single input/output hub 1220. However, the computing system 1200 may include a plurality of input/output hubs 1220.

The input/output hub 1220 may provide various interfaces with apparatuses. For example, the input/output hub 1220 may provide an accelerated graphics port (AGP) interface, peripheral component interface-express (PCIe), a communications streaming architecture (CSA) interface, or the like.

The graphic card 1250 may be connected to the input/output hub 1220 via an AGP or PCIe. The graphic card 1250 may control a display apparatus (not shown) for displaying an image. The graphic card 1250 may include an internal processor and an internal semiconductor memory apparatus for processing image data. According to embodiments, the input/output hub 1220 may include a graphics device in the input/output hub 1220 instead of the graphics card 1250, or may include a graphics device in addition to the graphics card 1250 that is located outside the input/output hub 1220. The graphic apparatus included in the input/output hub 1250 may be referred to as integrated graphics. Additionally, the input/output hub 1220 that includes a memory controller and a graphic apparatus may be referred to as a graphics and memory controller hub (GMCH).

The input/output controller hub 1230 may perform data buffering and interface mediation so that various system interfaces may efficiently operate. The input/output controller hub 1230 may be connected to the input/output hub 1220 via an internal bus. For example, the input/output hub 1220 and the input/output controller hub 1230 may be connected to each other via a direct media interface (DMI), a hub interface, an enterprise southbridge interface (ESI), PCIe, or the like.

The input/output controller hub 1230 may provide various interfaces with peripheral apparatuses. For example, the input/output controller hub 1230 may provide a USB port, a serial advanced technology attachment (SATA) port, a general purpose input/output (GPIO), a low pin count (LPC) bus, a serial peripheral interface (SPI), PCI, PCIe, or the like.

According to embodiments, two or more elements, from among the processor 1210, the input/output hub 1220, and the input/output controller hub 1230, may be implemented as a chipset.

While the inventive concept has been particularly shown and described with reference to exemplary embodiments thereof, it will be understood that various changes in form and details may be made therein without departing from the spirit and scope of the following claims.

What is claimed is:
1. A memory device comprising:
a delay circuit including a plurality of transistors and configured to receive an input signal, invert the input signal, and output the inverted input signal as an output signal; and
circuit blocks configured to control an operation of reading or writing memory cell data in response to at least one of the input signal or the output signal,
wherein at least one of the plurality of transistors included in the delay circuit has a thickest gate insulation film among the transistors included in the delay circuit, and
wherein the delay circuit comprises:
a first resistor comprising a first set of two or more transistors connected between a source of a power voltage and a first node, the first set of two or more transistors including gate insulating films having the same thicknesses;
a second resistor comprising a second set of two or more transistors connected between a second node and a ground voltage, the second set of two or more transistors including gate insulating films having the same thicknesses;
an inverter comprising a third set of two or more transistors connected between the first node and the second node, and configured to invert the input signal and output the inverted input signal as the output signal, at least two transistors of the third set of two or more transistors including gate insulating films having different thicknesses from each other; and
a loader comprising a fourth set of two or more transistors implemented as capacitors, a first transistor of the fourth set of two or more transistors connected between the source of the power voltage and an output of the inverter, and a second transistor of the fourth set of two or more transistors connected between the output of the inverter and the ground voltage.

2. The memory device of claim 1, wherein a thickness of the thickest gate insulation film in the delay circuit is determined as having a value such that an effect of negative biased temperature instability (NBTI) or positive biased temperature instability (PBTI) on the transistors is minimized.

3. The memory device of claim 1, wherein the third set of two or more transistors of the inverter comprises:
   a first transistor having a source connected to the first node, a drain connected to the output signal, and a gate connected to the input signal; and
   a second transistor having a source connected to the second node, a drain connected to the output signal, and a gate connected to the input signal.

4. The memory device of claim 1, wherein each of the circuit blocks includes a plurality of circuit block transistors, and in each of the circuit blocks, at least one of plurality of circuit block transistors has a thicker insulation film among the transistors included in the circuit block.

5. A memory device comprising:
   a delay circuit configured to receive an input signal, invert the input signal, and output the inverted input signal as an output signal, the delay circuit comprising:
      a first resistor comprising a first transistor and a second transistor connected between a source of a power voltage and a first node, the first transistor and the second transistor including gate insulating films having a first thickness,
      a second resistor comprising a third transistor and a fourth transistor connected between a second node and a ground voltage, the third transistor and the fourth transistor including gate insulating films having a second thickness,
      an inverter comprising a fifth transistor and a sixth transistor connected between the first node and the second node, and configured to invert an input signal and output the inverted input signal as an output signal, the fifth transistor and the sixth transistor including gate insulating films having different thicknesses and at least one of the fifth transistor and the sixth transistor including a gate insulating film having a third thickness, and
      a loader comprising a seventh transistor implemented as a capacitor and connected between the source of the power voltage and an output of the inverter and an eighth transistor implemented as a capacitor and connected between the output of the inverter and the ground voltage; and
   circuit blocks configured to control an operation of reading or writing memory cell data in response to at least one of the input signal or the output signal.

6. The memory device of claim 5, wherein the third thickness is greater than the first thickness and the second thickness.

7. The memory device of claim 5, wherein the first thickness and the third thickness are greater than the second thickness.

8. The memory device of claim 5, wherein the second thickness and the third thickness are greater than the first thickness.

9. The memory device of claim 5, wherein at least one of the seventh transistor and the eight transistor has a gate insulating film having the third thickness.

10. The memory device of claim 9, wherein the first thickness and the third thickness are greater than the second thickness.

11. The memory device of claim 9, wherein the second thickness and the third thickness are greater than the first thickness.

12. A delay circuit comprising:
    a first resistor comprising a first transistor and a second transistor connected between a source of a power voltage and a first node, the first transistor and the second transistor including gate insulating films having a first thickness;
    a second resistor comprising a third transistor and a fourth transistor connected between a second node and a ground voltage, the third transistor and the fourth transistor including gate insulating films having a second thickness;
    an inverter comprising a fifth transistor and a sixth transistor connected between the first node and the second node, and configured to receive an input signal, invert the input signal, and output the inverted input signal as an output signal, the fifth transistor and the sixth transistor including gate insulating films having different thicknesses and at least one of the fifth transistor and the sixth transistor including a gate insulating film having a third thickness; and
    a loader comprising a seventh transistor implemented as a capacitor and connected between the source of the power voltage and an output of the inverter and an eighth transistor implemented as a capacitor and connected between the output of the inverter and the ground voltage.

13. The delay circuit of claim 12, wherein the third thickness is greater than the first thickness and the second thickness.

14. The delay circuit of claim 12, wherein the first thickness and the third thickness are greater than the second thickness.

15. The delay circuit of claim 12, wherein the second thickness and the third thickness are greater than the first thickness.

16. The delay circuit of claim 12, wherein the seventh transistor includes a gate insulating film having the first thickness, and
    wherein the eight transistor includes a gate insulating film having the second thickness.

17. The delay circuit of claim 12, wherein at least one of the seventh transistor and the eight transistor has a gate insulating film having the third thickness.

18. The delay circuit of claim 17, wherein the first thickness and the third thickness are greater than the second thickness.

19. The delay circuit of claim 17, wherein the second thickness and the third thickness are greater than the first thickness.

* * * * *